(12) United States Patent
Arkles et al.

(10) Patent No.: US 11,634,811 B2
(45) Date of Patent: Apr. 25, 2023

(54) PROCESS FOR THIN FILM DEPOSITION THROUGH CONTROLLED FORMATION OF VAPOR PHASE TRANSIENT SPECIES

(71) Applicant: Gelest, Inc., Morrisville, PA (US)

(72) Inventors: Barry C. Arkles, Pipersville, PA (US); Alain E. Kaloyeros, Slingerlands, NY (US)

(73) Assignee: GELEST, INC., Morrisville, PA (US)

( * ) Notice: Subject to any disclaimer, the term of this patent is extended or adjusted under 35 U.S.C. 154(b) by 0 days.

(21) Appl. No.: 17/563,199

(22) Filed: Dec. 28, 2021

(65) Prior Publication Data

US 2022/0119940 A1 Apr. 21, 2022

Related U.S. Application Data

(60) Division of application No. 17/151,895, filed on Jan. 19, 2021, now Pat. No. 11,248,291, which is a (Continued)

(51) Int. Cl.
*C23C 16/24* (2006.01)
*C23C 16/16* (2006.01)
(Continued)

(52) U.S. Cl.
CPC .............. *C23C 16/24* (2013.01); *C23C 16/16* (2013.01); *C23C 16/4488* (2013.01);
(Continued)

(58) Field of Classification Search
CPC ..... C23C 16/24; C23C 16/16; C23C 16/4488; C23C 16/452; C23C 16/45553;
(Continued)

(56) References Cited

U.S. PATENT DOCUMENTS 6,346,477 B1 * 2/2002 Kaloyeros ............... C30B 29/02
257/E21.171
2006/0024964 A1 2/2006 Seo et al.
(Continued)

FOREIGN PATENT DOCUMENTS

| JP | 200754825 A | 3/2007 |
| TW | 201515109 A | 4/2015 |
| TW | 201732065 A | 9/2017 |

OTHER PUBLICATIONS

Ivanova et al. (J. Electrochem. Soc. 146 (6), 1999, pp. 2139-2145) (Year: 1999).*

(Continued)

*Primary Examiner* — Kelly M Gambetta
(74) *Attorney, Agent, or Firm* — Panitch Schwarze Belisario & Nadel LLP

(57) ABSTRACT

A method for deposition of a thin film onto a substrate is provided. The method includes providing a source precursor containing on or more of elements constituting the thin film, generating a transient species from the source precursor, and depositing a thin film onto the substrate from the transient species. The transient species being a reactive intermediate that has a limited lifetime in a condensed phase at or above room temperature.

14 Claims, 3 Drawing Sheets

Related U.S. Application Data continuation of application No. PCT/US2019/036515, filed on Jun. 11, 2019.

(60) Provisional application No. 62/718,424, filed on Aug. 14, 2018, provisional application No. 62/713,829, filed on Aug. 2, 2018.

(51) Int. Cl.
    *C23C 16/448*     (2006.01)
    *C23C 16/452*     (2006.01)
    *C23C 16/455*     (2006.01)
    *C30B 23/02*     (2006.01)
    *C30B 25/02*     (2006.01)
    *C30B 29/02*     (2006.01)
    *C30B 29/06*     (2006.01)
    *H01L 21/285*     (2006.01)

(52) U.S. Cl.
CPC ...... *C23C 16/452* (2013.01); *C23C 16/45553* (2013.01); *C30B 23/02* (2013.01); *C30B 25/02* (2013.01); *C30B 29/02* (2013.01); *C30B 29/06* (2013.01); *H01L 21/28525* (2013.01); *H01L 21/28568* (2013.01)

(58) Field of Classification Search
CPC ......... C30B 23/02; C30B 25/02; C30B 29/02; C30B 29/06
See application file for complete search history.

(56) References Cited

U.S. PATENT DOCUMENTS

| | | |
|---|---|---|
| 2007/0012249 A1 | 1/2007 | Miyazawa |
| 2015/0093891 A1 | 4/2015 | Zope et al. |
| 2017/0114453 A1 | 4/2017 | Chen et al. |

OTHER PUBLICATIONS

Lane et al. (Chem. Vap. Dep. 4(5), 1998, pp. 183-186) (Year: 1998).*

Yang et al. Direct-liquid-evaporation chemical vapor deposition of smooth, highly conformal cobalt and cobalt nitride thin films, J.Mater. Chem. C,2015, 3, 12098. (Year: 2015).*

Extended European Search Report dated Mar. 7, 2022 in EP Application No. 21212136.2.

Office Action and Search Report dated Feb. 7, 2022 in TW Application No. 108121077.

Arkles et al., "Synthesis and Exploratory Deposition Studies of Isotetrasilane and Reactive Intermediates for Epitaxial Silicon," Inorganic Chemistry, vol. 58, pp. 3050-3057 (2019).

Brunets et al., "Low-temperature LPCVD of Si nanocrystals from disilane and trisilane (Silcore ®) embedded in ALD-alumina for non-volatile memory devices," Surface & Coatings Technology, vol. 201, pp. 9209-9214 (2007).

Imai et al., "Hydrogen atom assisted ALE of silicon," Applied Surface Science, vol. 82-82, pp. 322-326 (1994).

International Search Report and Written Opinion dated Jan. 13, 2020 in International Application No. PCT/US2019/036515.

Ivanova et al., "The Effects of Processing Parameters in the Chemical Vapor Deposition of Cobalt from Cobalt Tricarbonyl Nitrosyl," Journal of the Electrochemical Society, vol. 146, No. 6, pp. 2139-2145 (1999).

Kaloyeros et al., "Review-Cobalt Thin Films: Trends in Processing Technologies and Emerging Applications," ECS Journal of Solid State Science and Technology, vol. 8, No. 2, pp. P119-P152 (2019).

Office Action dated Apr. 2, 2021 in U.S. Appl. No. 17/151,895, by Arkles.

Office Action dated May 5, 2021 in U.S. Appl. No. 17/151,895, by Arkles.

Office Action dated Jul. 26, 2021 in U.S. Appl. No. 17/151,895, by Arkles.

Written Opinion dated Sep. 3, 2020 in International Application No. PCT/US2019/036515.

Written Opinion dated Nov. 6, 2020 in International Application No. PCT/US2019/036515.

Office Action dated Mar. 29, 2022 in JP Application No. 2021502975.

Raghunath et al., "Ab Initio Chemical Kinetics for SiH2 + Si2H6 and SiH3 + Si2H5 Reactions and the Related Unimolecular Decomposition of Si3H8 under a-Si/H CVD Conditions," Journal of Physical Chemistry, vol. 117, No. 42, pp. 10811-10823 (2013) (Abstract Only).

Office Action dated Aug. 30, 2022 in CN Application No. 201980049650.6.

* cited by examiner

PROCESS FOR THIN FILM DEPOSITION THROUGH CONTROLLED FORMATION OF VAPOR PHASE TRANSIENT SPECIES

CROSS-REFERENCE TO RELATED APPLICATIONS

This application is a divisional of co-pending U.S. patent application Ser. No. 17/151,895, filed Jan. 19, 2021, which is a continuation of International Application No. PCT/US2019/036515, filed Jun. 11, 2019, which was published on Feb. 6, 2020 under International Publication No. WO 2020/027921 A1, which claims priority to U.S. Provisional Patent Application No. 62/713,829, filed Aug. 2, 2018 and U.S. Provisional Patent Application No. 62/718,424, filed Aug. 14, 2018, the disclosures of which are herein incorporated by reference in their entirety.

BACKGROUND OF THE INVENTION

This invention relates to methods for thin film deposition including chemical vapor deposition (CVD), atomic layer deposition (ALD), and other vapor phase deposition techniques such as molecular layer deposition (MLD), and self-assembled monolayer (SAM) deposition that allow the formation of a thin film onto a substrate with precise composition, morphology, structure, and thickness through controlled formation of vapor phase and/or surface intermediates.

The ever-increasing drive toward smaller, denser, and more functional semiconductor and hetero-device structures is requiring significant reduction in the thermal budget involved in the various processing steps necessary to grow such structures. This reduction is mandated given not only the thermally fragile nature of the constantly decreasing thicknesses of the various thin film building blocks of such structures, but also the use of new elements in semiconductor architectures, multi-element compounds, and highly doped materials that are thermally fragile and can lose their integrity, alter their properties and performance, and/or react undesirably with the surrounding substructures. Additionally, the introduction of more flexible, typically carbon-based, substrates, such as plastic or polymer substrates, further strains processing temperatures.

In one such critical application, chemical vapor deposition (CVD) of epitaxial silicon (e-Si) has become an essential building block in achieving performance improvement in metal oxide semiconductor field effect transistors by increasing the concentration of embedded germanium (Ge) in the Si matrix. Further strain enhancement in the embedded SiGe (e-SiGe) system is still required with decreasing feature size due to disproportionate reduction in device area caused by non-scaled gate length. This enhancement requires lowering the CVD e-SiGe processing temperatures below 600° C., in order to eliminate structural defects in the deposition of silicon thin films, and employing higher order perhydridosilanes, such as trisilane. However, trisilane was observed to generate gas-phase particles due to much higher reactivity and lower dissociation energy compared to silane and disilane. For example, this concern required lowering the partial vapor pressure of trisilane in the reaction zone during the deposition process, which again resulted in an undesirable reduction in growth rates. The deposition of n-tetrasilane was found to provide good film quality at improved growth rates, but the lower limit of the deposition window was 650° C.

In yet another such critical application, CVD or ALD of cobalt (Co) thin and ultrathin film structures have found a myriad of new applications across a variety of industrial sectors. In particular, metallic cobalt films play a key role in the reliability of integrated circuitry (IC) devices, as metallic cobalt films exhibit greater resistance to electromigration and lower tendency to undergo diffusion, thereby giving them a higher comparative stability relative to copper (Cu) in environments that involve both elevated temperature and high current density induced stresses. These properties have compelled consideration for a wealth of applications in IC systems, both in traditional architectures as well as novel systems associated with cobalt magnetic dipole moment, such as spintronic and giant magnetoresistance (GMR) devices. IC device fabrication has adopted the use of cobalt in nanoscale metallization architectures.

A further advantage for IC technologies is that Co thin films can act as seed layers for electroplated cobalt and undergo post-deposition conversion to binary element compounds, such as cobalt silicide, cobalt sulfide, cobalt oxide and metallic alloys. For example, cobalt silicide ($CoSi_2$) conversion coatings are emerging as a viable replacement for titanium silicide in self-aligned silicide (salicide) applications due to a wider silicidation window, which is consistent with the requirements for generating finer line geometries. These commercial usages have spawned tremendous interest not only in optimizing and understanding Co film growth processes and resulting properties, but also in expanding their use in future IC products. Other uses of metallic cobalt and cobalt containing films (such as oxides, sulfides, silicides and nitrides) include magneto-optic recording media, data storage, sensor technologies, catalysts for growing carbon nanotubes and self-aligned nanowires, reflective thin films for optical devices and, more broadly, as antibacterial, decorative, protective and wear-resistant coatings.

Other critical applications include CVD and ALD of metals and semiconductors, such as copper (Cu), ruthenium (Ru), tantalum (Ta), titanium (Ti), tungsten (W), and their nitrides, silicides, oxides and carbides, where applicable, and CVD, ALD, MLD and SAM deposition of dielectric, organic, and insulating films.

Accordingly, it would be highly desirable to provide a low temperature process for the deposition of thin films through the controlled formation of vapor phase transient species to achieve precise film composition, morphology, structure, and thickness.

BRIEF SUMMARY OF THE INVENTION

According to the invention, high quality metal, semiconductor, dielectric, diffusion barrier, adhesion and wetting layers, and insulating films for a variety of advanced applications may be deposited or grown by CVD, ALD, MLD, or SAM deposition through the intentional and controlled formation of gas phase transient species that are designed to enable the growth of thin films and layered structures with specific and desired composition, morphology, texture, and structure.

In CVD, ALD, MLD, or SAM deposition of typical unitary (single element), binary (dual element), or ternary (triple element) thin film growth, a number of reactants comprising one or more precursors and one or more reactive or inert gases react to yield the target material. In this context, a precursor is defined as a compound or complex that carries one or more of the elements desired in the final thin film product and which participates in a chemical reaction to produce the ultimate target material on a substrate surface.

According to the invention, however, transient species are formed in the vapor phase from precursors and the transient species, in turn, are directed to react with substrates at relatively low temperatures to deposit films. The formation and deposition of these transient species on a substrate occur under conditions distinct and discrete from the transport, deposition, or decomposition of the parent precursor. This distinct and discrete generation of transient species enables the deposition of films in lower thermal or energetic substrate environments, enables the deposition of films at lower temperatures and ensures greater conformality of the deposited films, and allows film deposition on thermally or chemically fragile substrates. The transient species can be formed in-situ in the deposition chamber (FIG. 2), or ex-situ in a synthesis chamber which is distinct from but connected to the deposition chamber (FIG. 1).

In the context of the invention, the terms "transient" or "transitory species" are intended to mean a reactive intermediate which has a limited lifetime in the condensed phase at or above room temperature and which is formed in the vapor phase by elimination or loss of a relatively stable or less reactive byproduct from a precursor in an inert gas stream, or in a gas that does not participate in the reaction. A transient species can also be formed by reaction of an initially formed transient species with another appropriate gas. The transient or transitory species self-reaction is prevented by control of their concentration or their partial pressure in the vapor phase by utilization of vacuum, an inert gas or a gas that behaves as a stabilizer. The invention requires that the formation of the transient species is well-controlled and that there is minimal generation of other species that can interfere with the deposition or co-deposit with the transient species. Implicitly, this requires that the energetic conditions needed to generate the transient species are relatively mild, with upper limits of temperature practically in a range not exceeding 650° C. and electron ionization impact energies in a range not exceeding 20 eV.

According to the invention, it is possible to intentionally, controllably, and purposefully create these transient species from the original precursor structure and engineer their reaction, in order to eliminate undesirable gas-phase reactions or gas-phase depletion phenomena and to ensure efficient and controllable decomposition processes to enable the growth of thin films and layered structures with specific and desired composition, morphology, texture, and structure.

Also, according to the invention, the transient species are engineered such that the substrate surface does not drive their formation. Instead, the transient species are engineered to be more reactive with the substrate than their parent precursor. This is in contrast to the traditional thermally-driven deposition of thin films, where precursor conversion to a deposited film is driven by raising the substrate temperature to afford a chemical interaction. Similarly, plasma activation of substrates either direct or in close-proximity to the substrate, contrasts with the invention, because fragile substrates are altered or damaged by the highly energetic plasma environment.

In one embodiment, the transient species can be formed in a separate synthesis chamber or vessel from a starting precursor, and then these intermediates are introduced in the CVD, ALD, MLD, or SAM thin film processing chamber for consumption and film formation.

In another embodiment, the transient species are produced directly in the CVD, ALD, MLD, or SAM thin film deposition chamber.

The present invention does not include homolytic "cracking" of dimers which form equivalent radicals, molecular ions or radicals formed under thermal, plasma or ionizing conditions in which there are no stable byproducts. In essence, the hemolytic cracking of dimers is in equilibrium with the starting dimers and polymers, whereas precursors utilized in the invention lead to transient species in which the thermodynamics of deposition are intrinsically more favorable than recombination to form the initial precursor. By way of exemplary explanation, the method is entirely distinct from the concept of ex-situ pyrolysis of dimeric precursor such as di-para-xylylene in a first reaction chamber (external furnace) at very high temperatures (>680° C.) to produce a monomer such as para-xylylene, which is then released into a second (deposition) chamber to deposit a polymeric film at room temperature, but can reform the dimeric precursor in or on deposited film. The pyrolysis reaction to form the monomer cannot be carried out in-situ in the deposition chamber, because it would interfere with chemical reaction associated with the deposition of the desired coating.

In one embodiment, high quality epitaxial silicon capable of n and p-type doping, as well as tensile and compressive strained epitaxial Si (e-Si), are prepared by utilization of the transient species bis(trihydridosilyl)silylene. The films can be deposited at relatively low temperatures, namely at temperatures between 250° C. to 650° C. For example, bis(trihydridosilyl)silylene can be generated remotely or within the deposition chamber from the parent precursor isotetrasilane by thermal decomposition or plasma-assisted conditions. The process has advantages associated with relatively low thermal or low energy environments, and also exhibits a lack of formation of silicon nanoparticles in the gas phase. Depending on processing conditions, such as substrate temperature and transient species concentration, hydrogenated or non-hydrogenated amorphous silicon can also be formed. Alkylsilylenes can also be generated as transient species for the formation of SAMs by thermally driven hydrogen elimination hydrogen from alkyltrihydridosilanes.

In another embodiment, pure Co films are grown from the transient species $Co(CO)_2NO^*$, where the notation "*" indicates an unsatisfied coordination sphere. The films can be deposited at relatively low temperatures, namely at temperatures between 250° C. to 500° C. For example, $Co(CO)_2NO^*$ can be generated remotely or within the deposition chamber from the parent precursor cobalt tricarbonyl nitrosyl $Co(CO)_3NO$ by thermal decomposition or plasma-assisted conditions. In the presence of hydrogen, the transient species can be $HCo(CO)_2NO$. Similarly, $HCo(CO)_3^*$ may be a preferred transient species. The process has advantages associated with both relatively low thermal or low energy environments, and also eliminates particle formation in the gas phase.

In yet another example, the transient species $Co(CO)_2^*$ is generated by photolysis of cobalt tricarbonyl nitrosyl at a wavelength of about 220-250 nm in a carbon monoxide carrier gas. These transient species can also be generated in a similar fashion from other cobalt carbonyl compounds, such as dicobalt octacarbonyl, dicobalt hexacarbonyl t-butylacetylene and other cobalt carbonyl compounds as reviewed in Kaloyeros et al, ECS Journal of Solid State Science and Technology, 8 (2) P119-P152 (2019).

In another embodiment of the invention, silicon nitride films are formed by generating a transient species and then introducing the transient species into a deposition chamber in combination with a precursor with which it can then react to form a deposited film. For example, hydrogen azide is selected as a precursor since it can be intentionally and controllably directed at temperatures above 350° C. to form the transient species, nitrene, (HN:), which can then be introduced into a deposition chamber in combination with trisilane depositing silicon nitride at substrate temperatures between 150° to 300° C. While the deposition of silicon nitride at temperatures above 350° through the direct reaction of hydrogen azide with trisilane can occur simplistically in one step rather than two steps, the substrate would have to withstand temperatures above 350° C. without being thermally damaged for the reaction to be acceptable as a single step. The independent formation of the nitrene reduces the potential of thermally induced damage to the substrate. Similarly, diazomethane can be anticipated to intentionally and controllably directed to form a carbene by elimination of nitrogen and utilized to form silicon carbide films.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
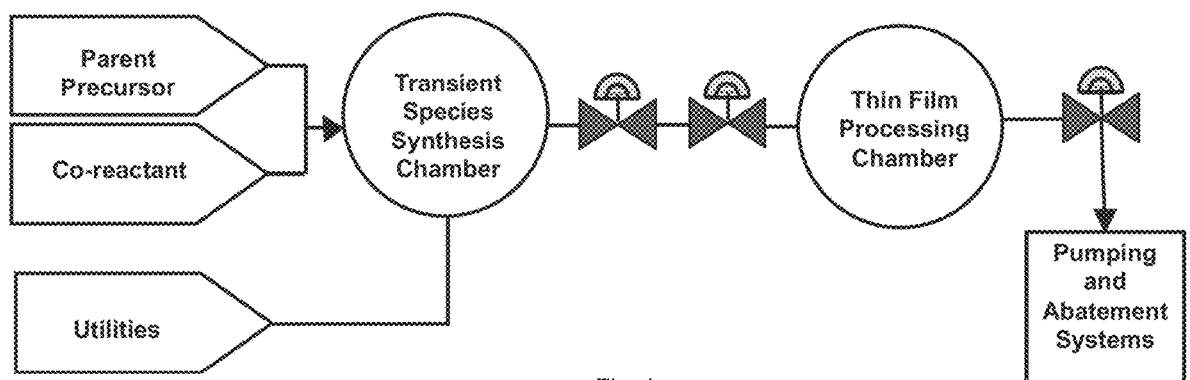
FIG. 1 is a schematic rendering of the apparatus for ex-situ formation of transient species that are then transported to a thin film processing chamber where they react to form a thin film on a substrate.

The present invention relates to high-quality thin films formed by CVD, ALD, MLD, or SAM deposition on various substrates, and a method for depositing such films. The method of the present invention may deposit such films as a thin amorphous or polycrystalline film or an epitaxial film on a substrate.

In one embodiment, the present invention relates to silicon-rich or silicon-based films formed from transient species generated from parent silane precursors, and further relates to associated methods for the CVD or ALD of such films on various substrates. As used herein, "silicon-rich films" refers to epitaxial or amorphous silicon and silicon alloys with germanium and carbon, as well as doped silicon thin films. For example, the silicon thin film may be doped with small amounts of arsenic, phosphorus and boron that modify silicon's properties, such as conductivity.

In another embodiment, the present invention relates to cobalt-rich or cobalt-based films formed from transient species generated from parent cobalt precursors, and further relates to associated methods for the CVD or ALD of such films on various substrates. As used herein, "cobalt-rich films" refers to epitaxial and amorphous cobalt and cobalt alloys or compounds, such as cobalt oxide and cobalt nitride.

Such high-quality films are especially useful on substrates such as semiconductor and solar cell substrates. Examples of the substrates that may be utilized for formation of either silicon-rich or silicon-based films or cobalt-rich or cobalt-based films include, for example, metals such as copper, tungsten, cobalt, ruthenium, titanium, and tantalum; metal compounds and alloys such as nitrides and carbides, silicon, silicon alloys with germanium and carbon, silicon dioxide, and the like which are found in IC and solar cell technologies.

There is essentially no limitation on the type of substrate that can be used in the present method. Preferably, however, the substrate is thermally and chemically stable at the conditions used for depositing the film or films onto the substrate. That is, the substrate is preferably stable at temperatures between about 150° C. and about 650° C. It will be understood by those skilled in the art that the thermal stability of the substrate may depend on various factors, such as the type of film to be deposited and the intended use of the coated substrate.

In the embodiment for formation of silicon-rich or silicon-based films, the parent precursors are preferably perhydridosilanes, and more preferably perhydridosilanes having from 2 to 8 silicon atoms. More preferably, the parent perhydridosilane precursor for generating the transient species to form silicon-rich or silicon-based films is isotetrasilane.

Under controlled CVD or ALD processing conditions, including specific temperature, pressure, and key processing conditions (such as providing additional tailored chemical, thermal, plasma, or ionization energy) to the parent perhydridosilane precursors, the parent precursors are converted to specific and desirable silylene transient species that are designed to grow epitaxial or amorphous films with specific composition, morphology and structure. For formation of the transient species, substrate temperatures are preferably in the range of 250°-600° C., and more preferably in the range of 375-500° C. For formation of the transient species, the reactor working pressure is preferably in the range of 10-150 torr, and more preferably in the range of 10-40 torr.

In one embodiment, the parent perhydridosilane precursor is preferably isotetrasilane and the silylene transient species generated from the isotetrasilane is bis(trihydridosilyl)silylene (($H_3Si$)$_2Si$), with silane as a byproduct Bis(trihydridosilyl)silylene (($H_3Si$)$_2Si$) can be generated from isotetrasilane by a variety of methods. In particular, bis(trihydridosilyl)silylene (($H_3Si$)$_2Si$) can be generated from isotetrasilane under controlled processing conditions, such as direct or remote plasma-assisted conditions, electron ionization at energy levels of 6 eV or greater (preferably between 6 eV and 15 eV, although energy levels as high as 70 eV can be employed), chemical ionization, and/or thermal decomposition at temperatures at or above 250° C.

Without wishing to be bound by theory, the mechanism for formation of bis(trihydridosilyl)silene appears to be the controlled and reproducible reductive elimination of silane from isotetrasilane, as shown below:

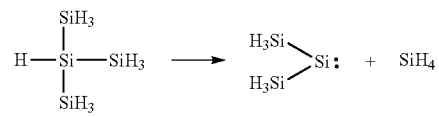

Branched perhydridosilanes, such as isotetrasilane, are preferred for the method of the invention, because they necessarily have a relatively greater proportion of Si atoms bonded to three hydrogens than their linear analogs. Branched perhydridosilanes are thus more likely to undergo dissociative adsorption. In this respect, the sticking coefficient ε, defined as the number of adsorbed molecules per number of impacts, of branched perhydridosilanes is expected to be higher than that of their linear analogs.

As such, the invention demonstrates that isotetrasilane is a superior candidate for CVD e-Si, particularly relative to its lower order perhydridosilane counterparts. The advantages of isotetrasilane include (i) the generation of bis(trihydridosilyl)silylene as the transient species for film formation, (ii) reduced particle formation in the reaction zone due to the inhibition of undesirable gas-phase reactions, and (iii) lower decomposition temperature due in part to its higher surface sticking coefficient.

Alternatively, bis(trihydridosilyl)silylene can be generated by the thermally-driven reaction of disilane with trisilane. Other homologs of bis(trihydridosilyl)silylene can be generated, for example, by the reaction of disilane with n-tetrasilane.

In the embodiment for formation of cobalt-rich or cobalt-based films, the parent cobalt precursors are preferably $Co^{(0)}$ precursors, and more preferably $Co^{(0)}$ precursors having a Co oxidation state of zero. In one such preferred embodiment, the parent $Co^{(0)}$ precursor for generating a transient cobalt coordination complex with an unsatisfied coordination sphere to form cobalt based films is cobalt tricarbonyl nitrosyl.

Under controlled CVD or ALD processing conditions, including specific temperature, pressure, and key processing conditions (such as providing additional tailored chemical, thermal, plasma, or ionization energy) to the parent $Co^{(0)}$ precursors, the parent cobalt precursors are converted to specific and desirable $Co(CO)_2NO^*$ transient species that are designed to grow epitaxial or amorphous films with specific composition, morphology and structure. For formation of the transient species, substrate temperatures are preferably in the range of 100°-500° C., and more preferably in the range of 250-400° C. For formation of the transient species, the reactor working pressure is preferably in the range of 5-50 torr, and more preferably in the range of 5-20 torr.

In one embodiment, the parent $Co^{(0)}$ precursor is preferably cobalt tricarbonyl nitrosyl and the cobalt transient species generated from the cobalt tricarbonyl nitrosyl precursor is $Co(CO)_2NO^*$. $Co(CO)_2NO^*$ can be generated from cobalt tricarbonyl nitrosyl by a variety of methods, forming CO or NO as a byproduct In particular, $Co(CO)_2NO^*$ can be generated from cobalt tricarbonyl nitrosyl under controlled processing conditions, such as direct or remote plasma-assisted conditions, electron ionization at energy levels of 1 eV or greater (preferably between 2 eV and 20 eV), chemical ionization, thermal decomposition, and/or photolysis. Substrate temperatures are preferably in the range of 100°-500° C., and more preferably in the range of 250-400° C. The reactor working pressure is preferably the range of 5-50 torr, and more preferably in the range of 5-20 torr.

Without wishing to be bound by theory, the mechanism for formation of the preferred transient $Co(CO)_2NO^*$ appears to be the loss of CO from the coordination sphere of cobalt in $Co(CO)_3NO$, as shown below:

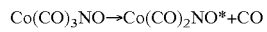

$Co(CO)_3NO \rightarrow Co(CO)_2NO^* + CO$

Figure 2:
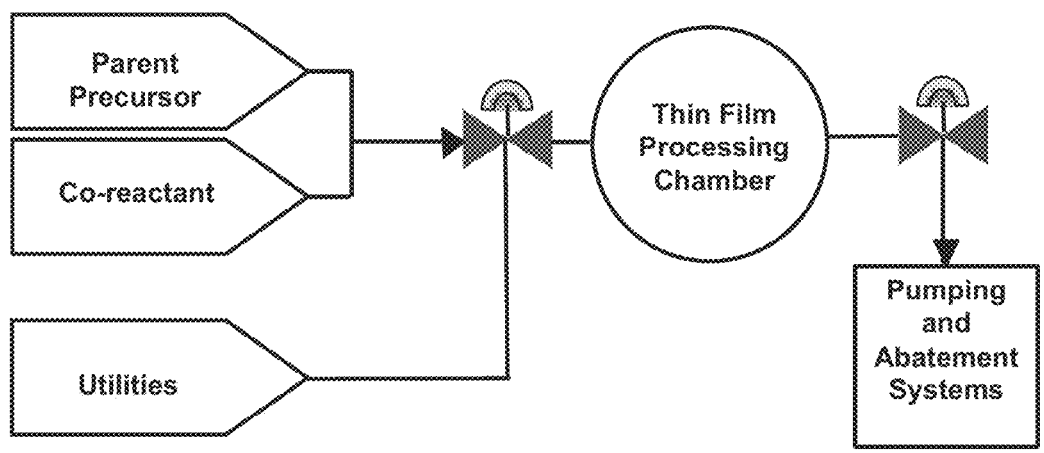
FIG. 2 is a schematic rendering of the apparatus for in-situ formation of transient species in the thin film deposition chamber where they then react to form a thin film on a substrate.

The further loss of the nitrosyl group, a so-called non-innocent ligand, to form $Co(CO)_2^*$ is another preferred transient cobalt species Referring to FIG. 2, in one embodiment, the parent precursor, and more particularly the parent silane or cobalt precursor, and even more particularly the parent perhydridosilane precursor or parent $Co^{(0)}$ precursor, is introduced into a CVD or ALD thin film deposition chamber, for production of the transient species directly in the deposition chamber, either in the vapor phase or on the substrate surface. The parent precursors may be introduced in the deposition chamber with or without an inert carrier gas, such as, for example, argon, hydrogen or nitrogen. The inert carrier gas which is utilized may depend upon the type of film to be formed. Preferably, the inert carrier gas is helium or argon.

In such an in-situ embodiment of the method, the deposition chamber is initially set to predetermined parameters particularly suited for transient species generation, in order to enable the conversion of the parent precursors to the transient species within the deposition chamber.

For example, where isotetrasilane is utilized as the parent precursor and thermal decomposition is utilized to convert the isotetrasilane to the transient silylyene species, namely bis(trihydridosilyl)silylene, the deposition chamber is preferably initially operated at a conversion temperature between about 250° C. and about 350° C. Alternatively, where cobalt tricarbonyl nitrosyl is utilized as the precursor and thermal decomposition is utilized to convert the cobalt tricarbonyl nitrosyl to the $Co(CO)_2NO$ intermediate (i.e., transient species), the deposition chamber is preferably initially operated at a conversion temperature between about 150° C. and about 250° C.

Concurrently, the substrate is preferably set to predetermined processing parameters (including during substrate introduction into the deposition reactor) to enable thermal decomposition of the transient species and formation of the film from the transient species (i.e., consumption of the transient species). In the thermal deposition processes, the substrate is preferably operated at a deposition temperature between about 250° C. and about 650° C., and more preferably between about 350° C. and about 550° C. The partial vapor pressure of the silylene transient species (e.g., bis (trihydridosilyl)silylene) or the cobalt transient species (e.g., $Co(CO)_2NO^*$) within the deposition chamber during the thermal deposition process is preferably less than 40 torr. The total system processing pressure, including that of the carrier gas and other volatile components, during the thermal deposition process is preferably from 1 torr up to 150 torr.

After generation of the transient species, the deposition chamber may then optionally be purged to remove all byproducts.

In one embodiment, hydrogen is used as co-reactant, either individually, or in combination with an inert gas such as argon.

Referring to FIG. 1, in another embodiment, the parent precursor is first introduced into a separate synthesis chamber or vessel (i.e., separate from the deposition chamber), where the transient species are generated controllably and reliably from the parent precursor, and then the transient species are generated and transported in the gas phase (with or without an inert carrier gas, and/or with or without a co-reactant such as hydrogen) to the CVD or ALD deposition chamber, where they are consumed in the thin film deposition process. The transient species may be in the deposition environment with precursor molecules and other carrier and/or reactant gases, as described above.

Preferably, the transient species synthesis chamber is connected under controlled conditions, such as by a vacuum interlock or valving system, to the deposition chamber. More particularly, the effluent or product of the transient species synthesis chamber (i.e., the silylene or $Co(CO)_2NO^*$ intermediate/transient species) is directly transported via a conduit or manifold system from the transient species synthesis chamber to the film deposition chamber. As such, the transient species synthesis chamber and the deposition chamber are connected directly with each other physically without exposure of the transient species to air or the surrounding environment.

In some embodiments, the controlled environment under which the transient species synthesis chamber is connected to the deposition chamber is one of vacuum, inert gas, hydrogen, reactive gas, or a combination of such gases.

In the transient species synthesis chamber, the silylene transient species can be generated from the perhydridosilane precursor in various manners, such as direct or remote plasma-assisted conditions, electron ionization at energy levels of 6 eV or greater (preferably between 6 eV and 15 eV), chemical ionization, and/or thermal decomposition. In one embodiment, where isotetrasilane is utilized as the parent precursor and thermal decomposition is utilized to convert the isotetrasilane to the silylene transient species, particularly bis(trihydridosilyl)silylene, the transient species synthesis chamber is preferably operated at a conversion temperature between about 250° C. and about 350° C.

Similarly, in the transient species synthesis chamber, the cobalt transient species can be generated from the parent $Co^{(0)}$ precursor in various manners, such as direct or remote plasma-assisted conditions, electron ionization at energy levels of 1 eV or greater (preferably between 1 eV and 20 eV), chemical ionization, photolysis and/or thermal decomposition. In one embodiment, where cobalt tricarbonyl nitrosyl is utilized as the parent precursor and thermal decomposition is utilized to convert the cobalt tricarbonyl nitrosyl to the $Co(CO)_2NO^*$ transient species, the synthesis chamber is preferably operated at a conversion temperature between about 150° C. and about 250° C.

In one embodiment, the transient species synthesis chamber contains a mechanism for separating reaction byproducts, such as a selective adsorption bed (e.g., activated carbon), a molecular sieve, a metal-organic framework that removes the byproducts from the vapor transport stream, a specific chamber design, or specialized chamber flow dynamics that enable separation of byproducts from reaction intermediates.

The deposition chamber, to which the transient species are transferred from the synthesis chamber, is preferably operated at a deposition temperature between about 150° C. and about 650° C., more preferably between about 350° C. and about 550° C. The partial processing pressure of the transient species (e.g., bis(trihydridosilyl)silylene or $Co(CO)_2NO^*$) within the deposition chamber during thermal deposition is preferably less than 40 torr. The total system processing pressure, including that of the carrier gas and other volatile components, is preferably from 1 torr up to 150 torr.

With respect to the above-described embodiments, the deposition chamber is preferably equipped with a vacuum manifold and a pumping system to maintain an appropriate pressure. It is also preferred that the deposition chamber includes a temperature control system, and gas or vapor handling capability to meter and control the flow of reactants and products resulting from the process.

In all of the above-described embodiments, the deposition process typically takes from about 30 seconds to about 30 minutes, most preferably about 5 minutes. However, it will be understood that the time may vary dependent upon the type of film to be deposited, the processing conditions and the desired film thickness.

In one embodiment, under specific low temperature and low reaction vapor pressure parameters in CVD or ALD processing, and low precursor partial vapor pressure in an inert carrier gas or hydrogen stream, as discussed above, the parent isotetrasilane is converted reliably and controllably to the transient species bis(trihydridosilyl)silylene through the reductive elimination of silane from isotetrasilane. The bis(trihydridosilyl)silylene has the capacity to be stable and long-lived (i.e., half-lives consistent with transport time requirements). Further, the bis(trihydridosilyl)silylene retains two trihydridosilyl groups that undergo dissociative adsorption with the substrate, in order to produce high quality epitaxial silicon films capable of n and p-type doping, such as phosphorus and boron, as well as tensile and compressive strained epitaxial Si (e-Si), when deposited in combination with germanium or carbon-containing precursors, germane, or trisilapentane.

In another embodiment, the silylene transient species is pentahydrdidosilylene generated from the parent precursor n-tetrasilane at temperatures greater than 650° C. Pentahydrdidosilylene can be used directly for the deposition process at temperatures below 600° C., but it also can be engineered to rearrange to bis(trihydridosilyl)silylene, a preferred transient species.

In another embodiment, bis(trihydridosilyl)silylene is formed by the reliable and reproducible reaction of disilane with trisilane at temperatures above 350° C. Without being bound by theory, the reaction is thought to occur by the decomposition of disilane to silylene ($H_2Si$:), hydrogen and silane. The silylene inserts into trisilane forming isotetrasilane which, in turn, forms bis(trihydridosilyl)silylene and silane.

In one embodiment, under low temperature and low reaction vapor pressure in CVD or ALD processing, and low precursor partial vapor pressure in an inert carrier gas or hydrogen stream, as discussed above, the parent cobalt tricarbonyl nitrosyl molecule was reliably and controllably converted to the transient species $Co(CO)_2NO^*$ through the elimination of CO from cobalt tricarbonyl nitrosyl. The $Co(CO)_2NO^*$ transient species has the capacity to be stable and long-lived (i.e., half-lives consistent with transport time requirements). Further, the $Co(CO)_2NO^*$ retains CO and NO groups that undergo dissociative adsorption with the substrate, in order to produce high quality cobalt films.

The above examples of transient species are exemplary and are not intended to be limiting. Those skilled in the art recognize that other transient species may also be formed and used in thin film deposition applications for copper (Cu), ruthenium (Ru), tantalum (Ta), titanium (Ti), tungsten (W), and their nitrides, oxides and carbides as well as dielectric, organic, polymeric, and insulating films.

Figure 3:
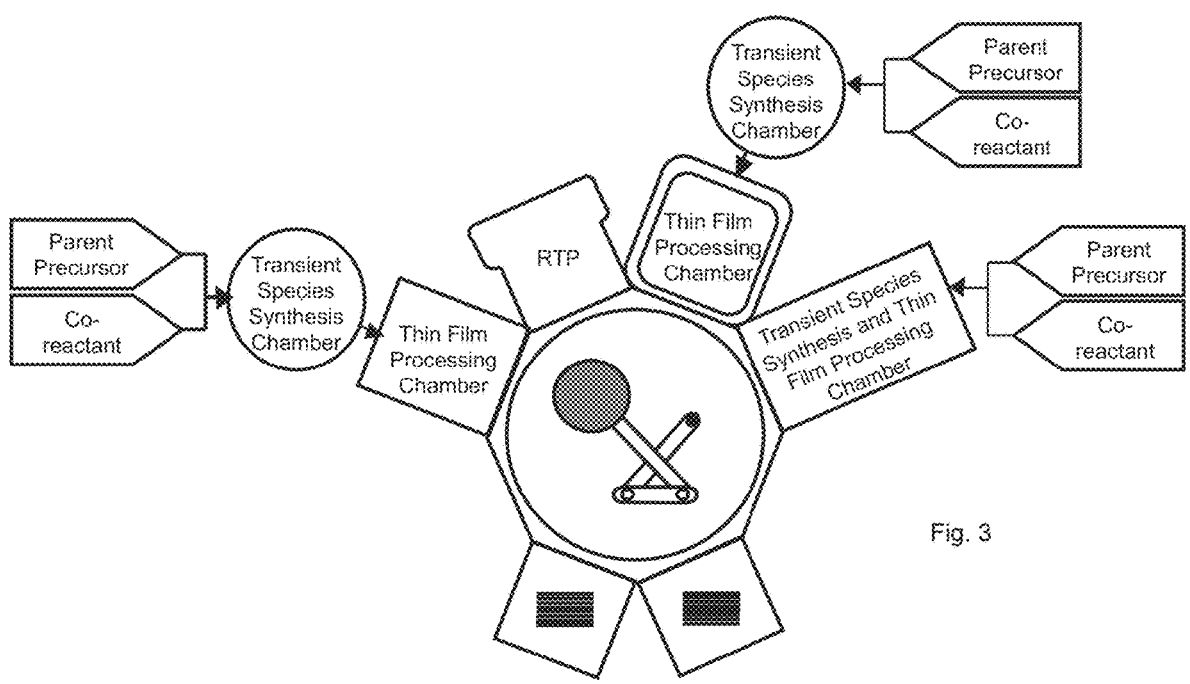
FIG. 3 is a schematic rendering of a manufacturing cluster tool equipped with modules for ex-situ and in-situ synthesis of transient species that are then reacted in thin film processing chambers.

In one embodiment, as shown in FIG. 3, the inventive process may utilize a manufacturing cluster tool equipped with modules for ex-situ and in-situ synthesis of the transient species that are then reacted in thin film processing chambers.

The invention will now be described in terms of the following, non-limiting examples.

EXAMPLES

Example 1: The transient species bis(trihydrosilyl)silylene was generated in situ by the reductive elimination of silane from isotetrasilane. The results of these experiments are shown in Table 1.

TABLE 1

Selected Comparative Results for CVD e-Si Studies from bis(trihydridosilyl)silylene

| Example | Precursor | Deposition Process Temperature (° C.) | Total System Process Pressure (torr) | Growth Rate (nm/min) | Gas Phase Reactions |
|---|---|---|---|---|---|
| 1 (comparative) | Silane | 650° | 80 | 11 | No |
| 2 (comparative) | Silane | 750° | 100 | 97 | Yes. Gas phase depletion* |
| 3 (comparative) | Disilane | 650° | 100 | 18 | No |
| 4 (comparative) | Disilane | 700° | 100 | 28 | Yes. Gas phase depletion* |
| 5 (comparative) | n-Tetrasilane | 600° | 100 | <10 | No |
| 6 (comparative) | Isotetrasilane | 550° | 100 | 13 | Yes. Gas phase depletion* |
| 7 (comparative) | Isotetrasilane | 550° | 40 | 26 | Yes. Gas phase depletion* |
| 8 (innovative) | Bis(trihydridosilyl)silylene | 550° | 10 | 35 | No |
| 9 (comparative) | Isotetrasilane | 525° | 100 | 18 | Yes. Gas phase depletion* |
| 10 (innovative) | Bis(trihydridosilyl)silylene | 500° | 100 | 12 | No |

*Thermodynamic pathways that lead to gas-phase depletion reactions and, ultimately, formation of particles in the gas-phase. The latter are believed to be caused by the occurrence of ring systems due to cyclization, leading to the manifestation of gas-phase clusters (nanoparticles) which consist of neutral or negatively charged hydrogenated silicon compounds. B. Arkles et al., Inorganic Chemistry, 2019, 58, 3050-3057.

The data shows that if the processing parameters are not tightly controlled, e.g., if the substrate temperature and/or parent precursor partial pressure are too high, the parent precursor self-reacts or reacts either with other silylenes or volatile species and causes gas phase particle formation, instead of forming the desired transient species.

Example 2: Various experiments were conducted utilizing $Co(CO)_2NO*$ in accordance with the present method. The $Co(CO)_2NO*$ was generated in situ by the elimination of CO from cobalt tricarbonyl nitrosyl. The results of these experiments are shown in Table 2.

TABLE 2

Selected Results for CVD Co Studies from $Co(CO)_2NO*$.

| Precursor | Deposition Process Temperature (° C.) | Deposition Process Pressure, (torr) | Film Composition | Gas Phase Reactions |
|---|---|---|---|---|
| cobalt tricarbonyl nitrosyl (comparative) | 200° | 1.5 | CoO contaminated with N | No |
| cobalt tricarbonyl nitrosyl (comparative) | 250° | 1.5 | CoO contaminated with N | No |
| $Co(CO)_2NO*$ (innovative) | 350° | 1.5 | Pure Co | No |
| $Co(CO)_2NO*$ (innovative) | 390° | 1.5 | Pure Co | No |
| $Co(CO)_2NO*$ (innovative) | 420° | 1.5 | Pure Co | No |

TABLE 2-continued

Selected Results for CVD Co Studies from Co(CO)$_2$NO*.

| Precursor | Deposition Process Temperature (° C.) | Deposition Process Pressure, (torr) | Film Composition | Gas Phase Reactions |
|---|---|---|---|---|
| Co(CO)$_2$NO* (innovative) | 450° | 1.5 | Pure Co | No |
| Co(CO)$_2$NO* (innovative) | 480° | 1.5 | Pure Co | No |

*See above note with respect to Table 1.

The data shows a reduction in contaminants with temperature, with pure Co forming above 350° C. Significantly, if the temperature is too low, the parent precursor is partially decomposed without the formation of the desired intermediate, which causes film contamination.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for deposition of a cobalt-based thin film onto a substrate surface, the method comprising:
   providing a deposition chamber containing a substrate;
   providing a synthesis chamber which is distinct from but connected to the deposition chamber;
   connecting the synthesis chamber to the deposition chamber with a vacuum interlock or valving system;
   providing a cobalt source precursor to the synthesis chamber;
   maintaining the working pressure in the synthesis chamber in the range of 5 to 150 ton;
   generating a cobalt-containing vapor phase transient species from the source precursor in the synthesis chamber; wherein the vapor phase transient species is generated independently from the substrate surface;
   wherein the temperature of the synthesis chamber during generation of the vapor phase transient species is maintained at a temperature of about 150° C. to about 250° C.;
   controlling a concentration or partial pressure of the vapor phase transient species in the synthesis chamber using a vacuum, inert gas, or a stabilizing gas to prevent self-reaction of the transient species;
   (a) maintaining the partial pressure of the vapor phase transient species at 5 to 50 Torr and maintaining the substrate at a temperature of about 100° C. to about 400° C.; or
   (b) maintaining the partial pressure of the vapor phase transient species at 5 to 20 Torr and maintaining the substrate at a temperature of about 100° C. to about 500° C.; and
   delivering the vapor phase transient species to the deposition chamber, wherein the vapor phase transient species decomposes to form a cobalt-based thin film on the substrate.

2. The method of claim 1, wherein the cobalt source precursor has a cobalt oxidation state of zero.

3. The method of claim 1, wherein the vapor phase transient species is Co(CO)$_2$NO* and/or Co(CO)$_2$*.

4. The method of claim 2, wherein the cobalt source precursor is dicobalt octacarbonyl, dicobalt hexacarbonyl t-butylacetylene, or cobalt tricarbonyl nitrosyl.

5. The method of claim 1, wherein hydrogen is used as a co-reactant in the synthesis chamber, optionally in combination with an inert gas.

6. The method of claim 5, wherein the vapor phase transient species is HCo(CO)$_2$NO* and/or HCo(CO)$_3$*.

7. The method of claim 1, wherein the method for deposition of the cobalt-based thin film onto the substrate surface is a method selected from the group consisting of chemical vapor deposition, atomic layer deposition, molecular layer deposition, and self-assembled monolayer deposition.

8. A method for deposition of a cobalt-based thin film onto a substrate in a deposition chamber, the method comprising:
   providing a deposition chamber containing a substrate;
   equipping the deposition chamber with a vacuum manifold and a pumping system to maintain pressure in the deposition chamber;
   providing a cobalt source precursor to the deposition chamber;
   heating the deposition chamber to a conversion temperature between about 150° C. and about 250° C. to generate a vapor phase transient species from the cobalt source precursor in-situ in the deposition chamber, wherein the vapor phase transient species is generated independently from the substrate surface;
   controlling a concentration or partial pressure of the vapor phase transient species in the deposition chamber using a vacuum, inert gas, or a stabilizing gas to prevent self-reaction of the transient species;
   (a) maintaining the partial pressure of the vapor phase transient species at 5 to 50 Torr and maintaining the substrate at a temperature of about 100° C. to about 400° C.; or
   (b) maintaining the partial pressure of the vapor phase transient species at 5 to 20 Torr and maintaining the substrate at a temperature of about 100° C. to about 500° C.;
   wherein the vapor pressure of the transient species and the substrate temperature are controlled to inhibit self-reaction of the transient species during their synthesis and prevent gas phase depletion; and
   subsequently depositing a cobalt-based thin film on the substrate from the vapor phase transient species.

9. The method of claim 8, wherein the cobalt source precursor has a cobalt oxidation state of zero.

10. The method of claim 8, wherein the vapor phase transient species is Co(CO)$_2$NO* and/or Co(CO)$_2$*.

11. The method of claim 9, wherein the cobalt source precursor is dicobalt octacarbonyl, dicobalt hexacarbonyl t-butylacetylene, or cobalt tricarbonyl nitrosyl.

12. The method of claim 8, wherein hydrogen is used as a co-reactant, optionally in combination with an inert gas.

13. The method of claim 12, wherein the vapor phase transient species is $HCo(CO)_2NO^*$ and/or $HCo(CO)_3^*$.

14. The method of claim 8, wherein the method for deposition of the cobalt-based thin film onto the substrate surface is a method selected from the group consisting of chemical vapor deposition, atomic layer deposition, molecular layer deposition, and self-assembled monolayer deposition.

* * * * *